(12) United States Patent
Albinet

(10) Patent No.: US 8,928,406 B2
(45) Date of Patent: Jan. 6, 2015

(54) LOW-POWER INVERTER-BASED DIFFERENTIAL AMPLIFIER

(71) Applicant: Texas Instruments Incorporated, Dallas, TX (US)

(72) Inventor: Xavier Albinet, Roquefort les Pins (FR)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 13/845,469

(22) Filed: Mar. 18, 2013

(65) Prior Publication Data

US 2014/0266445 A1   Sep. 18, 2014

(30) Foreign Application Priority Data

Mar. 13, 2013   (EP) .................................... 13290056

(51) Int. Cl.
*H03F 3/45* (2006.01)
(52) U.S. Cl.
USPC .............................. 330/253; 330/9; 330/258
(58) Field of Classification Search
USPC ............................................. 330/253, 9, 258
IPC ......................................................... H03F 3/45
See application file for complete search history.

(56) References Cited

U.S. PATENT DOCUMENTS

| | | | |
|---|---|---|---|
| 6,278,321 B1 * | 8/2001 | Franck | 330/254 |
| 6,281,751 B1 * | 8/2001 | Maulik | 330/255 |
| 6,556,081 B2 * | 4/2003 | Muza | 330/253 |
| 7,863,841 B2 * | 1/2011 | Menegoli et al. | 318/400.29 |
| 8,106,710 B2 * | 1/2012 | Montalvo | 330/254 |
| 8,674,765 B2 * | 3/2014 | Mengad | 330/255 |
| 2008/0094110 A1 * | 4/2008 | Hughes | 327/103 |

OTHER PUBLICATIONS

Chae, Y., et al.; "Low Voltage, Low Power, Inverter-Based Switched-Capacitor Delta-Sigma Modulator"; IEEE Journal of Solid-State Circuits; vol. 44, No. 2, Feb. 2009; 15 pages.

* cited by examiner

*Primary Examiner* — Patricia Nguyen
(74) *Attorney, Agent, or Firm* — Alan A. R. Cooper; Frederick J. Telecky, Jr.

(57) ABSTRACT

A new inverter-based fully-differential amplifier is provided including one or more common-mode feedback transistors coupled to each inverter, which transistors operate in the liner region. Accordingly, due to the fully-differential nature of the new inverter-based fully-differential amplifier, the amplifier provides an improved Power Supply Rejection Ratio (PSRR), provides a reduced sensitivity to supply voltage and process or part variations, and does not require an auto-zeroing technique to be utilized, which ultimately saves power, all while utilizing the low-voltage and low-power advantages of an inverter-based design.

17 Claims, 4 Drawing Sheets

LOW-POWER INVERTER-BASED DIFFERENTIAL AMPLIFIER

RELATED APPLICATION(S)

This application claims the benefit of European Patent Application No. 13290056.4, filed Mar. 13, 2013, the contents of which are incorporated by reference as if fully rewritten herein.

TECHNICAL FIELD

This invention relates generally to differential amplifiers.

BACKGROUND

Differential amplifiers, as understood in the art, are commonly used building blocks in analog circuits. A known technique involving differential amplifiers is to use an inverter as a low-voltage rail-to-rail amplifier. However, this known technique provides only a pseudo-differential amplifier (rather than fully-differential). Because of this, previous inverter-based pseudo-differential amplifiers are sensitive to supply voltage variations and process or part variations, which can result in poor Power Supply Rejection Ratio (PSRR) and other added noise on the output.

SUMMARY

Generally speaking and pursuant to these various approaches, a new inverter-based fully-differential amplifier is provided. The inverter-based differential amplifier includes one or more common-mode feedback transistors coupled to each inverter that operates in the linear mode. Accordingly, the inverter-based differential amplifier becomes fully differential so as to provide an improved PSRR, reduced sensitivity to supply voltage and process or part variations, and does not require an auto-zeroing technique to be utilized, which ultimately reduces complexity, silicon surface area, and power usage. These and other benefits may become clearer upon making a thorough review and study of the following detailed description.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
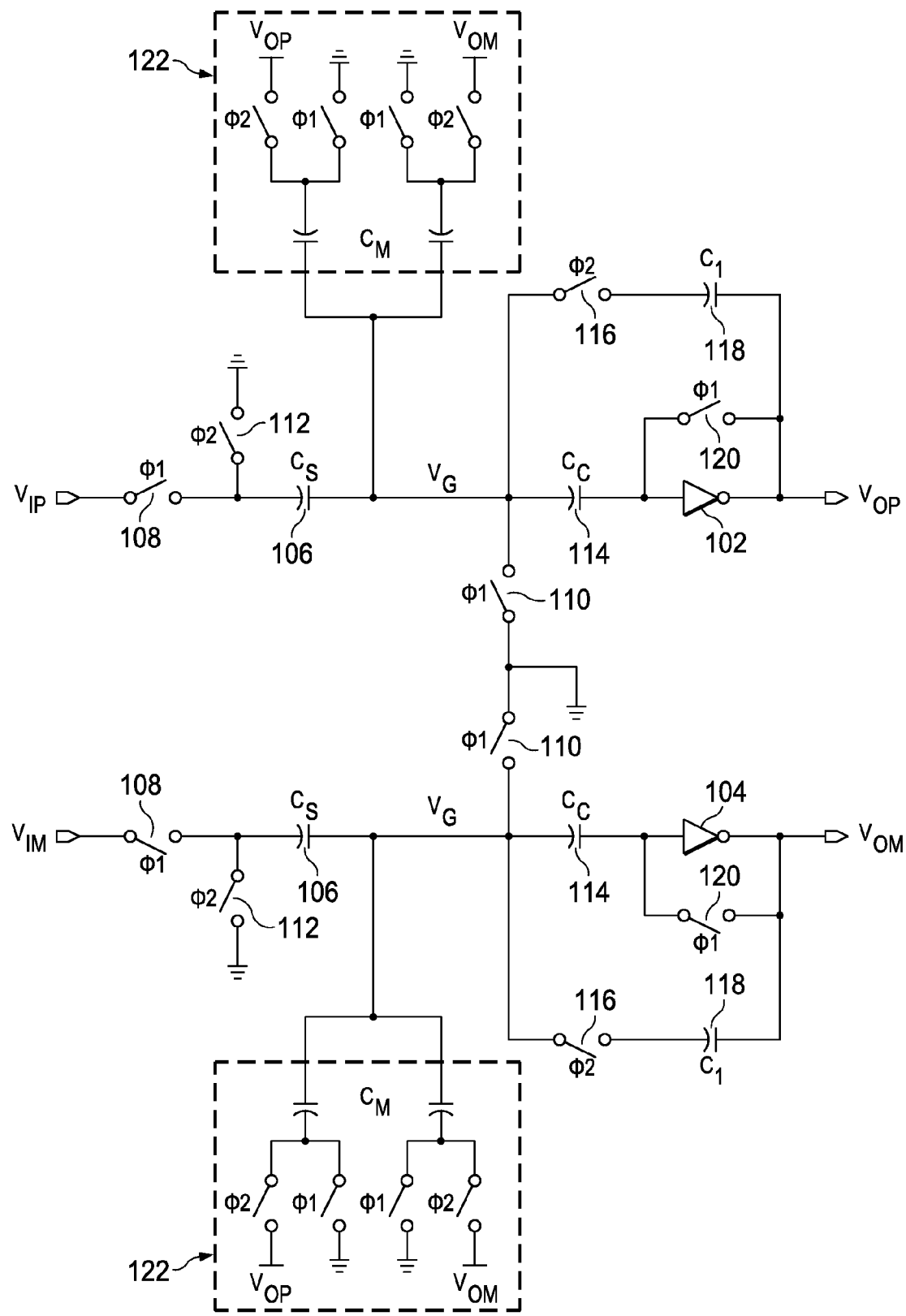
FIG. 1 is a high-level circuit diagram of an example implementation of a prior art inverter-based pseudo-differential amplifier.

Referring now to the drawings, FIG. 1 illustrates an example high-level circuit diagram of an implementation of a prior art inverter-based pseudo-differential amplifier. In this prior art example, a first inverter 102 and a second inverter 104 are used in a pseudo-differential configuration in an example switched-capacitor delta-sigma modulator to implement the functionality of an Operational Transconductance Amplifier (OTA). In such a configuration, the inverters 102, 104 operate as low-voltage rail-to-rail amplifiers, which provides for a low-power and low-voltage pseudo-differential amplifier. Such a configuration has been presented by Youngcheol Chae in his paper "Low Voltage, Low Power, Inverter-Based Switched-Capacitor Delta-Sigma Modulator" published the IEEE Journal of Solid-State Circuits, February 2009, volume 44, issue 2, pages: 458-472, the contents of which are incorporated herein by reference.

This example switched-capacitor integrator (used, for instance, with sigma-delta modulation) involves a two-phased ($\phi1$ and ($\phi2$) approach to load a differential input voltage (i.e., $V_{IP}$ and $V_{IM}$) on to sampling capacitors $C_s$ 106 during phase $\phi1$ through operation of switches 108 and 110. During phase $\phi2$, the charge in sampling capacitors $C_s$ 106 is then placed onto the input of each inverter 102, 104 by opening switches 108 and 110 and closing switch 112. Capacitor $C_c$ 114 is used for auto-zeroing to create a virtual ground ($V_G$) and to accommodate sampling offset. Switch 116 operates to reconnect the integrator feedback capacitor $C_I$ 118 to the input of the inverter 102, 104 during phase ($\phi2$ to complete the process. To implement this pseudo-differential approach, an auto-zeroing switch 120 is utilized to zero-out the inverter 102, 104 during each phase $\phi1$. Auto-zeroing is required in this pseudo-differential architecture to help remove offset between the differential inputs $V_{IP}$ and $VI_M$ through operation of switches 110 to remove any offset at the virtual ground $V_G$, and switches 120 to sample the offset. Further, to help remove offset, the capacitors and switches in sub-circuits 122 are added to help maintain a mid-point voltage on the input.

The particulars of this example configuration are not required to fully understand the operation of the inverter-based pseudo-differential amplifier or the new inverter-based fully-differential amplifier 200. However, auto-zeroing switches 110, 116, 120 and capacitors 114, 122 are required by the inverter-based pseudo-differential amplifier because single input inverters are used. These switches and capacitors increase the complexity and silicon surface area required. Further, such a configuration is not actually fully differential and thus is sensitive to supply voltage variations and process or part variations, which results in poor Power Supply Rejection Ratio (PSRR) and other added noise on an output.

Figure 2:
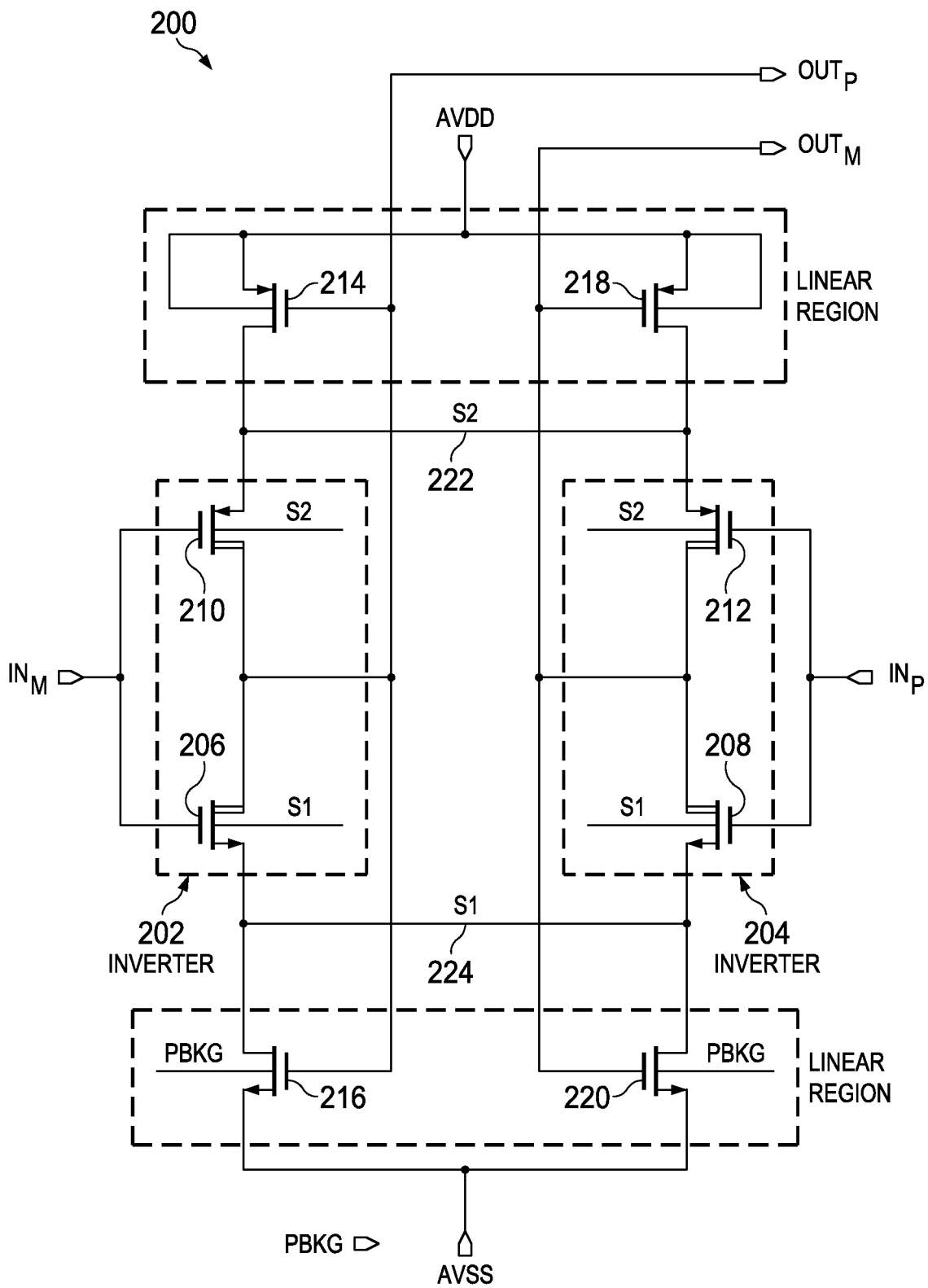
FIG. 2. illustrates a circuit diagram of an example new inverter-based fully-differential amplifier in accordance with various approaches.

To resolve the issues identified above, a new inverter-based fully-differential amplifier is provided 200. FIG. 2 illustrates a circuit diagram of the new inverter-based fully-differential amplifier 200 in accordance with various approaches. By one approach, the amplifier 200 is a class-AB rail-to-rail low-voltage amplifier, though the teachings disclosed herein may be readily applicable to other classes of amplifiers. The amplifier 200 may be further configured to operate as an operational transconductance amplifier (OTA). The amplifier 200 includes a first inverter 202 configured to receive a first half of a differential input signal (i.e., $IN_M$) and a second inverter 204 configured to receive a second half of the differential input signal (i.e., $IN_P$). By one approach, the inverters 202, 204 are CMOS inverters each including an n-channel CMOS transistor 206, 208 and a p-channel CMOS transistor 210, 212. The drains of the transistors 206, 210 of the first inverter 202 are coupled together to form the inverter output $OUT_P$, while the drains of the transistors 208, 212 of the second inverter 204 are coupled together to form the inverter output $OUT_M$. The outputs $OUT_P$ and $OUT_M$ together comprise a fully differential output signal. The sources of the p-channel transistors 210, 212 form the positive supplies of the inverters 202, 204 and the sources of the n-channel transistors 206, 208 form the negative supplies of the inverters 202, 204. The gates of the p-channel transistor 210 and n-channel transistor 206 of the first inverter 202 are both coupled to one half of the input signal (i.e., $IN_m$) and the gates of the p-channel transistor 212 and n-channel transistor 208 of the second inverter 204 are both coupled to the other half of the input signal (i.e., $IN_P$). By one approach, the substrates of the p-channel transistors 210, 212 are coupled to a positive power supply (i.e., AVDD) and the substrates of the n-channel transistors 206, 208 are coupled to a negative power supply (i.e., AVSS). This configuration allows for rail-to-rail operation on the output with each output signal $OUT_M$ and $OUT_P$ being opposite to its respective input signal $IN_M$ and $IN_P$ (i.e., "inverted"). The output signals $OUT_M$ and $OUT_P$ are each currents that relate to an approximate inverse of the respective half of the input signals $IN_M$ and $IN_P$.

The amplifier 200 also includes a first p-channel transistor 214 and a first n-channel transistor 216, each coupled to the first inverter 202, and a second p-channel transistor 218 and a second n-channel transistor 220, each coupled to the second inverter 204. Each of the first and second p- and n-channel transistors 214, 216, 218, 220 is configured to operate in a linear mode or linear region and to operate as a common-mode feedback control for each inverter 202, 204. By using this linear mode common-mode feedback control, the amplifier 200 is configured to control a common-mode signal on the output signals $OUT_M$ and $OUT_P$. By one approach, each of these additional transistors 214, 216, 218, 220 are CMOS transistors, though other transistor topologies are possible.

In one example, the transistors 214, 216, 218, 220 are coupled to the first and second inverter 202, 204 as follows. The first p-channel transistor 214 is configured such that its drain is operatively coupled to the positive supply of the first inverter 202 (i.e., the source of the p-channel transistor 210 of the first inverter 202), its gate to the output signal $OUT_P$, and its source to a positive power supply (i.e., AVDD). The second p-channel transistor 218 is similarly configured such that its drain is operatively coupled to the positive supply of the second inverter 204 (i.e., the source of the p-channel transistor 212 of the first inverter), its gate to the output signal $OUT_M$, and its source to the positive power supply. The first n-channel transistor 216 is configured such that its drain is operatively coupled to the negative supply of the first inverter 202 (i.e., the source of the n-channel transistor 206 of the first inverter 202), its gate to the output signal $OUT_P$, and its source to a negative power supply (i.e., AVSS). The second n-channel transistor 220 is similarly configured such that its drain is operatively coupled to the negative supply of the second inverter 204 (i.e., the source of the n-channel transistor 208 of the second inverter 204), its gate to the output signal $OUT_M$, and its source to the negative power supply.

By another approach, the positive supplies of the first and second inverters 202, 204 are coupled together to form a positive node 222 and the negative supplies of the first and second inverters 202, 204 are coupled to form a negative node 224. This coupling effectuates the fully-differential aspect of the amplifier 200. The amplifier 200 effectuates linear mode common-mode feedback control to these nodes 222, 224 through the first and second p- and n-channel transistors 214, 216, 218, 220 to control the common-mode signal on the differential outputs $OUT_P$ and $OUT_M$. To do this, the amplifier 200 is configured to adjust an effective resistance between the positive node 222 and the positive voltage power supply with the first and second p-channel transistors 214, 218 and to adjust an effective resistance between the negative node 224 and the negative voltage power supply with the first and second n-channel transistors 216, 220.

So configured, an inverter-based fully-differential amplifier 200 is provided. The fully-differential aspect of the amplifier 200 allows for a high Common Mode Rejection Ratio (CMRR) for rejection of common mode noise, high Power Supply Rejection Ration (PSRR), and very low sensitivity to process or part variations. With non-fully-differential amplifiers, such as the pseudo-differential amplifiers shown in FIG. 1, the open ended outputs do not reject these common mode elements as well. For example, if some noise exists on one input to the pseudo-differential amplifier, or parts or processing are not exactly symmetric for each side of the signal chain, then this noise or non-symmetry can manifest itself as noise on the output signals. However, with the fully-differential amplifier 200, this noise will be rejected at a much higher rejection rate. For example, the disclosed inverter-based fully-differential amplifier 200 may produce a PSRR greater than approximately 40 dB without the use of non-auto-zeroing techniques.

It may be desirable in some instances to achieve a higher gain than may be output by a single stage of the inverter-based fully-differential amplifier 200. A single stage may be capable of producing a gain of approximately 50-60 dB. However, if these teachings are repeated for a second stage amplifier, output gain can increase to as much as 80 dB or more.

Figure 3:
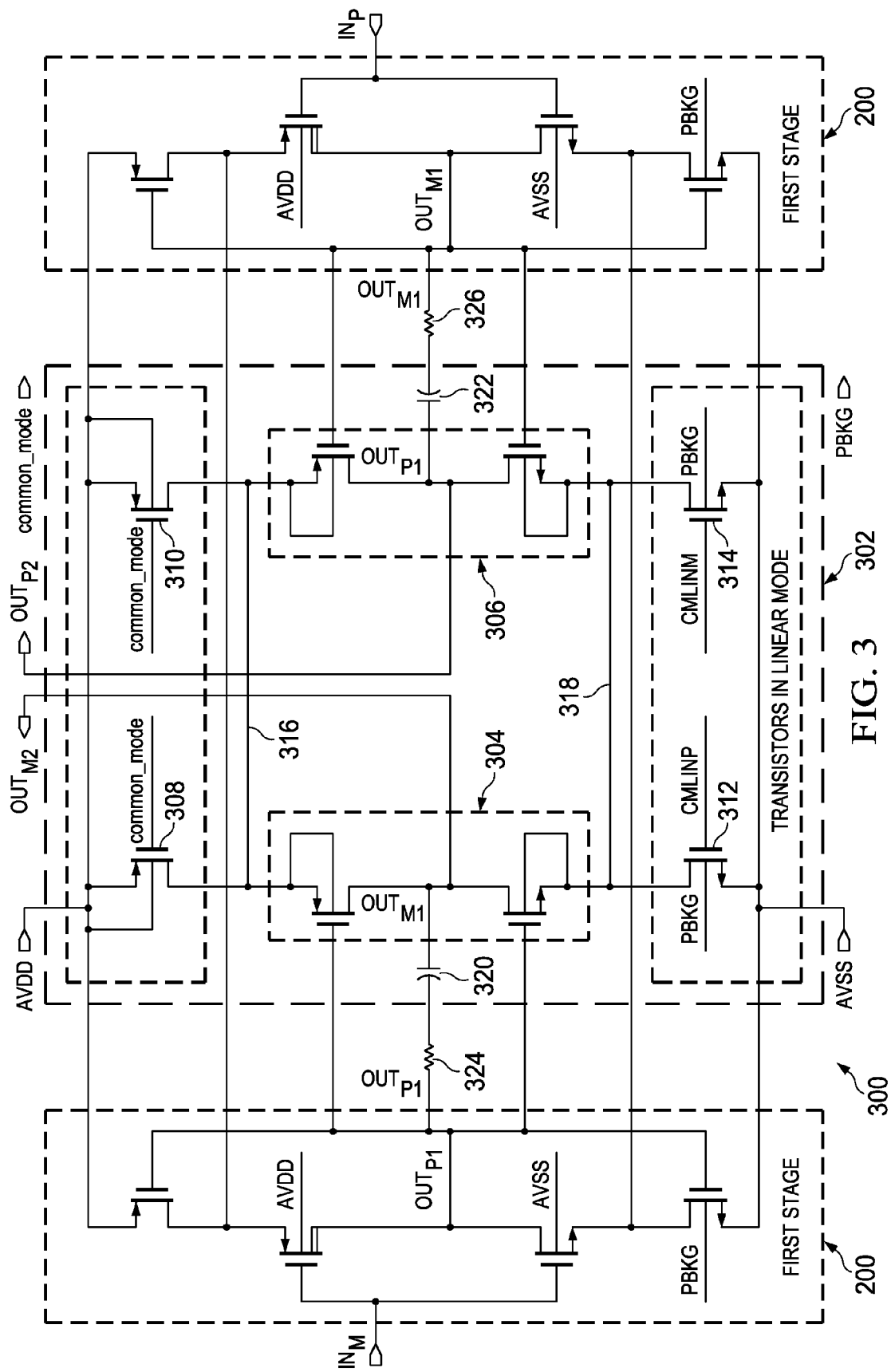
FIG. 3 illustrates an multiple-stage version of the new inverter-based fully-differential amplifier of FIG. 2 in accordance various approaches.

Referring now to FIG. 3, a multi-stage version 300 of the inverter-based fully-differential amplifier 200 is illustrated in accordance with various approaches. The first half and the second half of the previously described inverter-based fully-differential amplifier 200 are shown as before in FIG. 2. Together, these halves comprise the first stage 200 of the illustrated multi-stage amplifier 300 (here illustrated as having two stages). By at least one approach, the second stage 302 of the multi-stage amplifier 300 is simply a repeated version of first stage 200 with a select few modifications. For example, the second stage 302 includes a third inverter 304 and a fourth inverter 306, which, like the first and second inverters 202, 204 of the first stage 200, receive an input differential signal and output the second stage output differential signal. In this instance, the input signal to the second stage is the output signal of the first stage 200 (with the third inverter 304 receiving the $OUT_P$ signal and the fourth inverter 306 receiving the $OUT_M$ signal). The output signal of the second stage 302 is a fully differential signal $OUT_{P2}$ and $OUT_{M2}$.

Like the first stage 200, the second stage amplifier 302 includes third and fourth p-channel and n-channel transistors

308, 310, 312, 314, each of which is configured to operate in the linear region. As before, these transistors 308, 310, 312, 314, and the transistors of the third and fourth inverters 304, 306, are CMOS transistors by at least one approach. The third p-channel transistor 308 is configured such that its drain is operatively coupled to the positive supply of the third inverter 304, its gate to the output signal $OUT_{M2}$, and its source to the positive power supply. The fourth p-channel transistor 310 is similarly configured such that its drain is operatively coupled to the positive supply of the fourth inverter 306, its gate to the output signal $OUT_{P2}$, and its source to the positive power supply. The third n-channel transistor 312 is configured such that its drain is operatively coupled to the negative supply of the third inverter 304, its gate to the output signal $OUT_{M2}$, and its source to the negative power supply. The fourth n-channel transistor 314 is similarly configured such that its drain is operatively coupled to the negative supply of the fourth inverter 306, its gate to the output signal $OUT_{P2}$, and its source to the negative power supply.

Also like the first stage 200, by at least one approach, the positive supplies of the third and fourth inverters 304, 306 are coupled together to form a second positive node 316 and the negative supplies of the third and fourth inverters 304, 306 are coupled to form a second negative node 318. The effective resistance between the second positive node 316 and the positive voltage supply can be adjusted by the third and fourth p-channel transistors 308, 310 operating parallel to each other and in the linear region. The effective resistance between the second negative node 318 and the negative voltage supply can be adjusted by the third and fourth n-channel transistors 312, 314 also operating parallel to each other and in the linear region.

Figure 4:
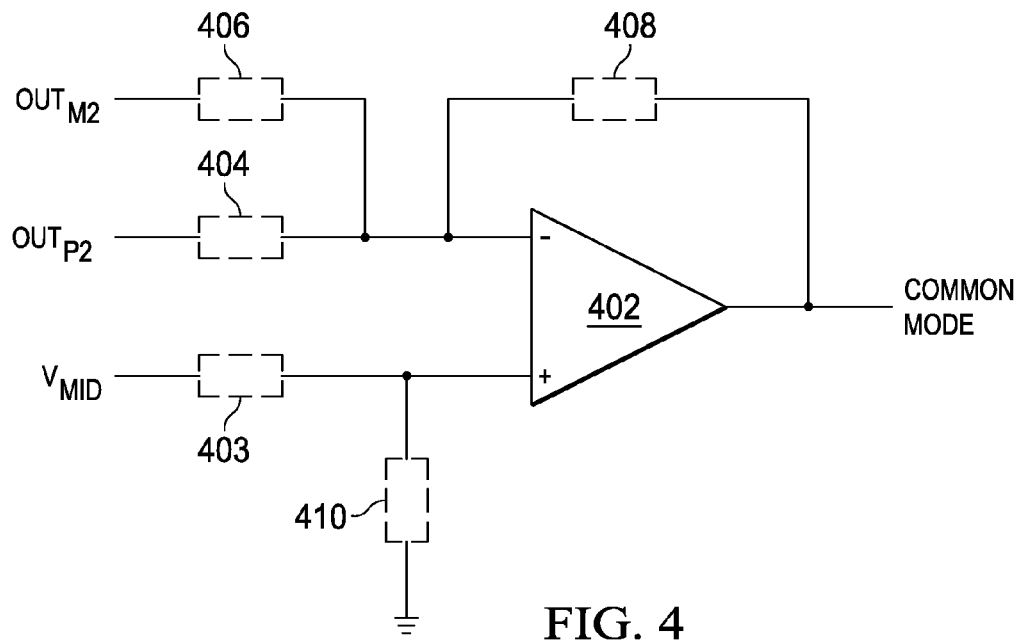
FIG. 4 illustrates a common mode signal amplifier in accordance with various approaches.

By another approach, the third and fourth p-channel transistors 308, 310 receive a common mode signal at their respective gates instead of the second stage output signal ($OUT_{P2}$ and $OUT_{M2}$). As is shown in FIG. 4, by one approach, the common mode signal is generated by a common mode amplifier 402 (such as an op amp) receiving on one input an ideal or desired common mode signal (such as a $V_{MID}$ signal, representing the ideal middle signal of the outputs $OUT_{P2}$ and $OUT_{M2}$, possibly through a resistor 403, and possibly tied to ground through resistor 410) and receiving on the other input an average of the actual outputs of the second stage amplifier $OUT_{P2}$ and $OUT_{M2}$. The average may be achieved by adding the two signals $OUT_{P2}$ and $OUT_{M2}$ through one or more resistors 404, 406. The common mode amplifier 402 then amplifies the actual common mode signal that exists on the second stage output $OUT_{P2}$ and $OUT_{M2}$ by amplifying the difference between the average of the second stage outputs $OUT_{P2}$ and $OUT_{M2}$ and the ideal desired common mode signal (possibly with feedback resistor 408). Returning to FIG. 3, the third and fourth p-channel transistors 308, 310 then use this common mode signal to improve the CMRR of the multi-stage amplifier 300 with improved accuracy and speed over the common mode signal. By another approach, the third and fourth n-channel transistors 312, 314 receive the common mode signal at their respective gates instead of the second stage output signal ($OUT_{P2}$ and $OUT_{M2}$).

Continuing with FIG. 3, by some approaches, the second stage output signal $OUT_{M2}$ is coupled to the first stage output signal $OUT_P$ and the second stage output signal $OUT_{P2}$ is coupled to the first stage output signal $OUT_M$ through one or more compensation capacitive components (i.e., capacitors 320 and 322) and/or resistive components (i.e., resistors 324 and 326) to ensure the stability of the multi-stage amplifier 300 by avoiding unwanted oscillation.

With this multi-stage inverter-based fully-differential amplifier 300, gain as high as 80 dB can be attained while maintaining the higher CMRR and PSRR as well as reduced sensitivity to process and part variations. Moreover, these teachings are highly scalable and can be employed using additional amplification stages, including a third stage, a fourth stage, or even further stages. Further, these teachings can be utilized with various other amplification stages and in various other configurations not discussed here.

Figure 5:
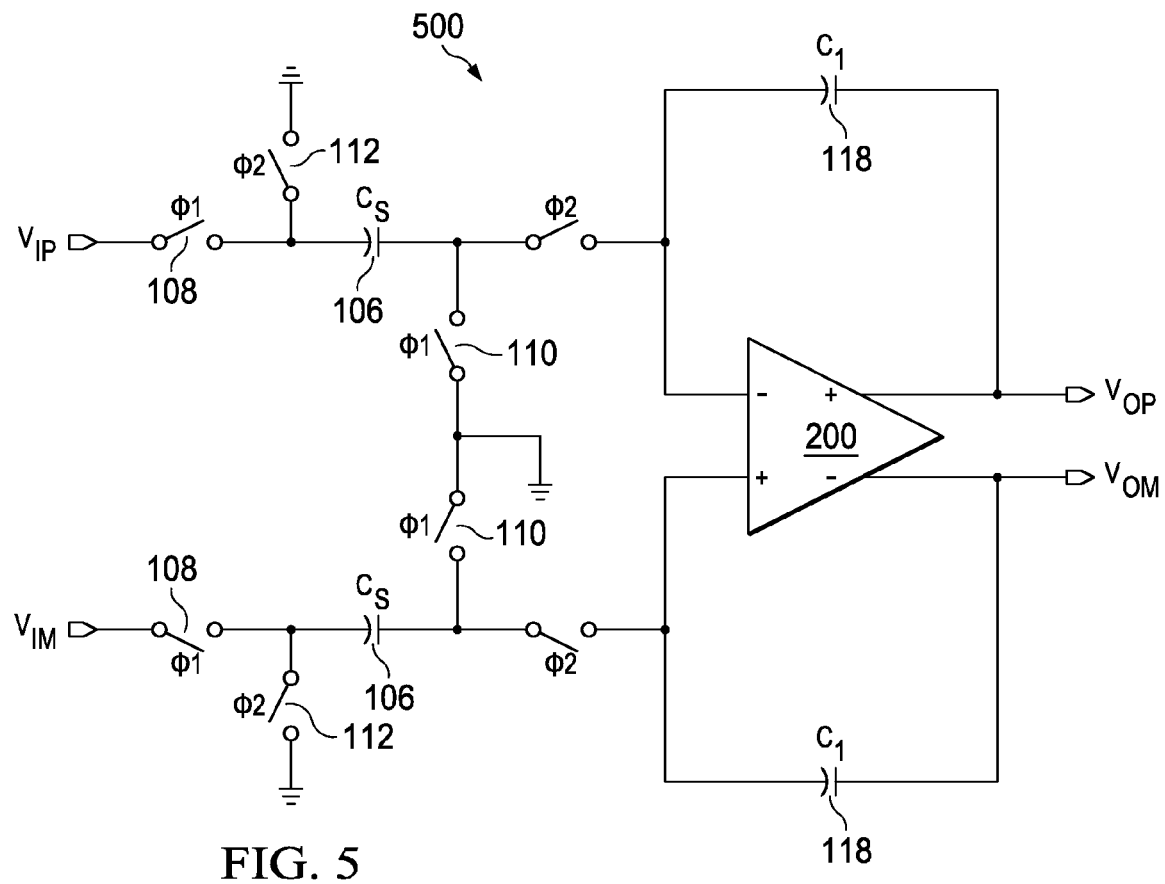
FIG. 5 illustrates an example version of the high-level circuit diagram of FIG. 1 modified to use the new inverter-based fully-differential amplifier in accordance with at least one approach.

Turning now to FIG. 5, a version of the example high-level circuit diagram of FIG. 1 is shown and modified to use the new inverter-based fully-differential amplifier 200 in accordance with at least one approach. The circuit of FIG. 5, like FIG. 1, shows the new inverter-based fully-differential amplifier 200 being used in an example switched-capacitor integrator configuration 500, such as a sigma-delta modulator, to implement the functionality of an Operational Transconductance Amplifier. However, because the new amplifier 200 is fully-differential, unlike the example shown in FIG. 1, the new amplifier 200 does not require the use of the auto-zeroing switches 120 nor of the switches and capacitors of the sub-circuit 122 in this example configuration 500. It should be noted, however, that the new amplifier 200 can still accommodate the use of auto-zeroing switches 120, which may improve some of the performance aspects, but they are not required unlike the example from FIG. 1. Further, these teachings are highly versatile and can be utilized in many different designs, including Digital-to-Analog Converter (DAC) circuits, reference voltage circuits, filters, or any other circuit that may benefit from the use of a low-voltage and low-lower inverter-based fully-differential amplifier 200 as has been disclosed.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An apparatus comprising:
    a class-AB rail-to-rail low voltage amplifier comprising:
        a first CMOS inverter configured to receive a first signal representative of a first half of a differential input signal;
        a second CMOS inverter configured to receive a second signal representative of a second half of the differential input signal;
        at least a first CMOS transistor coupled to the first CMOS inverter and configured to operate as a common-mode feedback control, wherein the at least a first CMOS transistor operates in a linear mode;
        at least a second CMOS transistor coupled to the second CMOS inverter and configured to operate as a common-mode feedback control, wherein the at least a second CMOS transistor operates in a linear mode;
    wherein the class-AB rail-to-rail low-voltage amplifier is configured to output a fully differential output signal.

2. The apparatus of claim 1 wherein a positive supply of the first CMOS inverter and a positive supply of the second CMOS inverter are coupled and wherein a negative supply of the first CMOS inverter and a negative supply of the second CMOS inverter are coupled.

3. The apparatus of claim 2 wherein the class-AB rail-to-rail low-voltage amplifier is configured to output the fully differential output signal having a PSRR of greater than approximately 40 dB without utilizing an auto-zeroing technique.

4. The apparatus of claim 1 wherein the at least a first CMOS transistor coupled to the first CMOS inverter further comprises:
   a first p-channel transistor configured to operate in a linear region, wherein:
      a drain of the first p-channel transistor is operatively coupled to the positive supply of the first CMOS inverter;
      a gate of the first p-channel transistor is operatively coupled to a first output signal of the fully differential output signal; and
      a source of the first p-channel transistor is operatively coupled to a positive power supply; and
   a first n-channel transistor configured to operate in a linear region, wherein:
      a drain of the first n-channel transistor is operatively coupled to the negative supply of the first CMOS inverter;
      a gate of the first n-channel transistor is operatively coupled to the first output signal; and
      a source of the first n-channel transistor is operatively coupled to a negative power supply; and
wherein the at least a second CMOS transistor coupled to the second CMOS inverter further comprises:
   a second p-channel transistor configured to operate in a linear region, wherein:
      a drain of the second p-channel transistor is operatively coupled to the positive supply of the second CMOS inverter;
      a gate of the second p-channel transistor is operatively coupled to a second output signal of the fully differential output signal; and
      a source of the second p-channel transistor is operatively coupled to the positive power supply; and
   a second n-channel transistor configured to operate in a linear region, wherein:
      a drain of the second n-channel transistor is operatively coupled to the negative supply of the second inverter;
      a gate of the second n-channel transistor is operatively coupled to the second output signal; and
      a source of the second n-channel transistor is operatively coupled to the negative power supply;
and wherein the positive supply of the first CMOS inverter and the positive supply of the second CMOS inverter are coupled and wherein the negative supply of the first CMOS inverter and the negative supply of the second CMOS inverter are coupled.

5. The apparatus of claim 1 wherein the class-AB rail-to-rail low voltage amplifier further comprises a fully differential operational transconductance amplifier.

6. A method comprising:
   at a class-AB rail-to-rail low-voltage CMOS inverter-based amplifier:
      receiving an input signal for processing to create an output signal;
      using linear mode common-mode feedback control to reduce a common-mode signal on the output signal of the class-AB rail-to-rail low-voltage CMOS inverter-based amplifier;
      outputting the output signal comprising a fully differential output signal having a Power Supply Rejection Ratio (PSRR) of greater than approximately 40 dB;
      wherein the class-AB rail-to-rail low-voltage amplifier is configured to output the fully differential output signal having a PSRR of greater than approximately 40 dB when operating in a non-auto-zeroing configuration.

7. The method of claim 6 wherein receiving an input signal for processing to create an output signal further comprises:
   a first CMOS inverter outputting a first half of the fully differential output signal by outputting a first output current relating to an approximate inverse of a first half of the input signal; and
   a second CMOS inverter outputting a second half of the fully differential output signal by outputting a second output current relating to an approximate inverse of a second half of the input signal.

8. The method of claim 6 wherein receiving an input signal for processing to create an output signal further comprises receiving a differential input signal comprising a first half of the differential input signal and a second half of the differential input signal.

9. The method of claim 6 wherein receiving the input signal for processing to create an output signal further comprises:
   at a first CMOS inverter:
      receiving a first half of the input signal;
      outputting a first half of the fully differential output signal;
   at a second CMOS inverter:
      receiving a second half of the input signal;
      outputting a second half of the fully differential output signal;
   wherein a positive supply of the first CMOS inverter and a positive supply of the second CMOS inverter are operatively coupled to form a positive node and a negative supply of the first CMOS inverter and a negative supply of the second CMOS inverter are operatively coupled to form a negative node; and
wherein using linear mode common-mode feedback control to reduce the common-mode signal on the output signal of the class-AB rail-to-rail low-voltage CMOS inverter-based amplifier further comprises:
   adjusting a resistance between the positive node and a positive voltage supply with a first p-channel transistor and a second p-channel transistor, wherein the first and second p-channel transistors are each configured to operate in a linear region and wherein the gate of the first p-channel transistor is operatively coupled to the first half of the fully differential output signal and wherein the gate of the second p-channel transistor is operatively coupled to the second half of the fully differential output signal; and
   adjusting a resistance between the negative node and a negative voltage supply with a first n-channel transistor and a second n-channel transistor, wherein the first and second n-channel transistors are each configured to operate in a linear region, and wherein a gate of the first n-channel transistor is coupled to the first half of the fully differential output signal and a gate of the second n-channel transistor is coupled to the second half of the fully differential output signal, and wherein the first and second n-channel transistors are configured to operate in a linear region.

10. The method of claim 9 further comprising:
   at a third CMOS inverter:
      receiving the first half of the fully differential output signal;
      outputting a first half of a second stage output signal;
   at a fourth CMOS inverter:
      receiving the second half of the fully differential output signal;
      outputting a second half of the second stage output signal;

wherein a positive supply of the third CMOS inverter and a positive supply of the fourth CMOS inverter are operatively coupled to form a second positive node and a negative supply of the third CMOS inverter and a negative supply of the fourth CMOS inverter are operatively coupled to form a second negative node;

at the second positive node:
adjusting a resistance between the second positive node and the positive voltage supply with a third p-channel transistor and a fourth p-channel transistor, wherein the third and fourth p-channel transistors are in parallel and each configured to operate in a linear region and wherein a gate of the third p-channel transistor is operatively coupled to at least one of the first half of the second stage output signal and a common mode signal, and wherein a gate of the fourth p-channel transistor is operatively coupled to at least one of the second half of the second stage output signal and the common mode signal; and at the second negative node:
adjusting a resistance between the second negative node and the negative voltage supply with a third n-channel transistor and a fourth n-channel transistor, wherein the third and fourth p-channel transistors are in parallel and each configured to operate in a linear region and wherein a gate of the third n-channel transistor is operatively coupled to the first half of the second stage output signal and a gate of the fourth n-channel transistor is operatively coupled to the second half of the second stage output signal.

11. The method of claim 10 further comprising:
at a common mode amplifier:
receiving a desired common mode signal;
receiving an average of the first half of the second stage output signal and the second half of the second stage output signal; and
amplifying the common mode of the first half of the second stage output signal and the second half of the second stage output signal by amplifying the difference between the received desired common mode signal and the received average of the first half of the second stage output signal and the second half of the second stage output signal to generate the common mode signal.

12. An apparatus comprising:
a first inverter comprising:
an input configured to receive a first input signal;
an output configured to output a first output signal;
a positive supply; and
a negative supply;
a second inverter comprising:
an input configured to receive a second input signal;
an output configured to output a second output signal;
a positive supply; and
a negative supply;
wherein the positive supply of the second inverter is operatively coupled to the positive supply of the first inverter and the negative supply of the second inverter is operatively coupled to the negative supply of the first inverter;
a first p-channel transistor configured to operate in a linear region, wherein:
a drain of the first p-channel transistor is operatively coupled to the positive supply of the first inverter;
a gate of the first p-channel transistor is operatively coupled to the first output signal; and
a source of the first p-channel transistor is operatively coupled to a positive power supply;
a second p-channel transistor configured to operate in a linear region, wherein:
a drain of the second p-channel transistor is operatively coupled to the positive supply of the second inverter;
a gate of the second p-channel transistor is operatively coupled to the second output signal; and
a source of the second p-channel transistor is operatively coupled to the positive power supply;
a first n-channel transistor configured to operate in a linear region, wherein:
a drain of the first n-channel transistor is operatively coupled to the negative supply of the first inverter;
a gate of the first n-channel transistor is operatively coupled to the first output signal; and
a source of the first n-channel transistor is operatively coupled to a negative power supply;
a second n-channel transistor configured to operate in a linear region, wherein:
a drain of the second n-channel transistor is operatively coupled to the negative supply of the second inverter;
a gate of the second n-channel transistor is operatively coupled to the second output signal; and
a source of the second n-channel transistor is operatively coupled to the negative power supply;
wherein the first output signal and the second output signal together comprise a fully differential signal.

13. The apparatus of claim 12 wherein the apparatus comprises a fully differential operational transconductance amplifier.

14. The apparatus of claim 12 further comprising:
a third inverter comprising:
an input operatively coupled to the first output signal;
an output operatively configured to output a third output signal;
a positive supply; and
a negative supply;
a fourth inverter comprising:
an input operatively coupled to the second output signal;
an output operatively configured to output a fourth output signal;
a positive supply; and
a negative supply;
wherein the positive supply of the fourth inverter is operatively coupled to the positive supply of the third inverter to form a second positive node and the negative supply of the fourth inverter is operatively coupled to the negative supply of the third inverter to form a second negative node;
a third p-channel transistor configured to operate in a linear region, wherein:
a drain of the third p-channel transistor is operatively coupled to the positive supply of the third inverter;
a gate of the third p-channel transistor is operatively coupled to at least one of the third output signal and a common mode signal; and
a source of the third p-channel transistor is coupled to the positive power supply;
a fourth p-channel transistor configured to operate in a linear region, wherein:
a drain of the fourth p-channel transistor is operatively coupled to the positive supply of the fourth inverter;
a gate of the fourth p-channel transistor is operatively coupled to at least one of the fourth output signal and the common mode signal; and a source of the fourth p-channel transistor is operatively coupled to the positive power supply;
a third n-channel transistor configured to operate in a linear region, wherein:
a drain of the third n-channel transistor is operatively coupled to the negative supply of the third inverter;
a gate of the third n-channel transistor is operatively coupled to the fourth output signal; and
a source of the third n-channel transistor is operatively coupled to the negative power supply;
a fourth n-channel transistor configured to operate in a linear region, wherein:
a drain of the fourth n-channel transistor is operatively coupled to the negative supply of the fourth inverter;
a gate of the fourth n-channel transistor is operatively coupled to the third output signal; and
a source of the fourth n-channel transistor is operatively coupled to the negative power supply;
wherein the third output signal and the fourth output signal comprise a second fully differential signal.

15. The apparatus of claim 14 further comprising a first compensation capacitive component operatively coupling the first output signal and the third output signal and a second compensation capacitive component operatively coupling the second output signal and the fourth output signal.

16. The apparatus of claim 14 wherein:
a substrate of a p-channel transistor of the first inverter and a substrate of a p-channel transistor of the second inverter are operatively coupled to the positive power supply; and
a substrate of an n-channel transistor of the first inverter and a substrate of an n-channel transistor of the second inverter are operatively coupled to the negative power supply.

17. The apparatus of claim 14 further comprising:
a common mode amplifier configured to receive a desired common mode signal and an average of the third output signal and the fourth output signal and output the common mode signal.

* * * * *